(12) United States Patent
Cao

(10) Patent No.: US 9,966,025 B1
(45) Date of Patent: May 8, 2018

(54) GATE DRIVING CIRCUIT

(71) Applicant: Shenzhen China Star Optoelectronics Technology Co., Ltd., Shenzhen (CN)

(72) Inventor: Shangcao Cao, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 471 days.

(21) Appl. No.: 14/779,330

(22) PCT Filed: Jun. 23, 2015

(86) PCT No.: PCT/CN2015/082030
§ 371 (c)(1),
(2) Date: Sep. 22, 2015

(87) PCT Pub. No.: WO2016/192142
PCT Pub. Date: Dec. 8, 2016

(30) Foreign Application Priority Data

Jun. 3, 2015 (CN) .......................... 2015 1 0299385

(51) Int. Cl.
*G09G 3/36* (2006.01)
*G11C 19/28* (2006.01)
(52) U.S. Cl.
CPC .......... *G09G 3/3648* (2013.01); *G09G 3/3677* (2013.01); *G09G 3/3696* (2013.01);
(Continued)
(58) Field of Classification Search
CPC .. G09G 3/3648; G09G 3/3677; G09G 3/3696; G09G 2310/0283; G09G 2310/0221; G11C 19/28
See application file for complete search history.

(56) References Cited

U.S. PATENT DOCUMENTS

2005/0052439 A1   3/2005   Liou
2016/0049126 A1*  2/2016   Zhang .................. G09G 3/3648
                                                          345/173

FOREIGN PATENT DOCUMENTS

CN      103927960 A      7/2014
CN      104376824 A      2/2015
(Continued)

*Primary Examiner* — Abbas I Abdulselam
(74) *Attorney, Agent, or Firm* — Leong C. Lei

(57) ABSTRACT

The present invention provides a gate driving circuit, of which respective odd stage GOA unit circuits are cascade connected, and respective even stage GOA unit circuits are cascade connected; the odd stage first, second scan control signals ($Vf_O$, $Vr_O$), the odd stage scan start signal ($STV_O$), the odd stage first, second high frequency clock signals ($CK1_O$, $CK2_O$) are located corresponding to the odd stage GOA unit circuits; the even stage first, second scan control signals ($Vf_E$, $Vr_E$), the even stage scan start signal ($STV_E$), the even stage first, second high frequency clock signals ($CK1_E$, $CK2_E$) are located corresponding to the even stage GOA unit circuits; by controlling the voltage levels of the odd stage first, second scan control signals ($Vf_O$, $Vr_O$) and even stage first, second scan control signals ($Vf_E$, $Vr_E$) in cooperation with the odd stage scan start signal ($STV_O$) and the even stage scan start signal ($STV_E$) of different sequences, the odd stage GOA unit circuits and the even stage GOA unit circuits can be controlled to perform forward scan or backward scan at the same time or in time division.

12 Claims, 9 Drawing Sheets

(52) U.S. Cl.
CPC ..... *G11C 19/28* (2013.01); *G09G 2310/0221* (2013.01); *G09G 2310/0283* (2013.01)

(56) References Cited

FOREIGN PATENT DOCUMENTS

| | | |
|---|---|---|
| CN | 104505048 A | 4/2015 |
| CN | 104537987 A | 4/2015 |

\* cited by examiner

|  | $Vf_O=H$ | $Vf_O=L$ |
|---|---|---|
| $Vf_E=H$ | 11 | 01 |
| $Vf_E=L$ | 10 | 00 |

Fig. 9

|  | $Vf_O=H$ | $Vf_O=L$ |
|---|---|---|
| $Vf_E=H$ | 1_1 | 0_1 |
| $Vf_E=L$ | 1_0 | 0_0 |

Fig. 10

GATE DRIVING CIRCUIT

FIELD OF THE INVENTION

The present invention relates to a liquid crystal display technology field, and more particularly to a gate driving circuit.

BACKGROUND OF THE INVENTION

The Liquid Crystal Display (LCD) possesses advantages of thin body, power saving and no radiation to be widely used in many application scope. Such as LCD TV, mobile phone, personal digital assistant (PDA), digital camera, notebook, laptop, and dominates the flat panel display field.

Most of the liquid crystal displays on the present market are backlight type liquid crystal displays, which comprise a liquid crystal display panel and a backlight module. The working principle of the liquid crystal display panel is that the Liquid Crystal is injected between the Thin Film Transistor Array Substrate (TFT array substrate) and the Color Filter (CF). The light of backlight module is refracted to generate images by applying driving voltages to the two substrates for controlling the rotations of the liquid crystal molecules.

The Active Matrix Liquid Crystal Display (AMLCD) is the most common liquid crystal display device at present. The Active Matrix Liquid Crystal Display comprises a plurality of pixels, and each pixel comprises a Thin Film Transistor (TFT). The gate of the TFT is coupled to the scan line extending along the horizontal direction. The drain of the TFT is coupled to the data line extending along the vertical direction. The source of the TFT is coupled to the corresponding pixel electrode. When a sufficient positive voltage is applied to some scan line in the horizontal direction, all the TFT coupled to the scan line will be activated to write the data signal loaded in the data line into the pixel electrodes and thus to show images to control the transmittances of different liquid crystals to achieve the effect of controlling colors.

The driving of the level scan line (i.e. the gate driving) in the present active liquid crystal display is mainly accomplished by the external Integrated Circuit (IC). The external IC can control the charge and discharge stage by stage of the level scan lines of respective stages. The GOA technology, i.e. the Gate Driver on Array technology can utilize the original manufacture processes of the liquid crystal display panel to manufacture the driving circuit of the level scan lines on the substrate around the active area, to replace the external IC for accomplishing the driving of the level scan lines. The GOA technology can reduce the bonding procedure of the external IC and has potential to raise the productivity and lower the production cost. Meanwhile, it can make the liquid crystal display panel more suitable to the narrow frame or non frame design of display products.

The scan way of the gate driving circuit according to prior art is generally simple, and only can perform forward scan or backward scan at a time, and perform scan row by row or interlaced scan at a time. Therefore, it is necessary to improve the gate driving circuit according to prior art for realizing the variety of scans for satisfying demands of various display products.

SUMMARY OF THE INVENTION

An objective of the present invention is to provide a gate driving circuit, capable of realizing the variety of scans to promote the display quality for satisfying demands of various display products.

For realizing the aforesaid objective, the present invention provides a gate driving circuit, comprising:

a plurality of GOA unit circuits, wherein respective odd stage GOA unit circuits are cascade connected, and respective even stage GOA unit circuits are cascade connected;

signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;

signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;

a common signal line, employed for providing a first low frequency clock signal and a second low frequency clock signal, located corresponding to all the GOA unit circuits;

the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;

N is set to be a positive integer and except the GOA unit circuits of the first, the second, the next to last and the last stages, in the Nth stage GOA unit circuit:

the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;

the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;

the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;

the pull-down holding module comprises: a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;

the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan.

In the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal.

Both the odd stage first scan control signal and the even stage first scan control signal are high voltage level, and both the odd stage second scan control signal and the even stage second scan control signal are low voltage level;

as starting the scan of a frame, the odd stage scan start signal is provided to the gate of the eleventh transistor of the first stage GOA unit circuit, and meanwhile, the even stage scan start signal is provided to the gate of the eleventh transistor of the second stage GOA unit circuit; the forward scan of the odd stage GOA unit circuits and the forward scan of the even stage GOA unit circuits are performed at the same time.

Both the odd stage first scan control signal and the even stage first scan control signal are high voltage level, and both the odd stage second scan control signal and the even stage second scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the eleventh transistor of the second stage GOA unit circuit; the forward scan of the odd stage GOA unit circuits and the forward scan of the even stage GOA unit circuits are performed in time division.

Both the odd stage first scan control signal and the even stage first scan control signal are low voltage level, and both the odd stage second scan control signal and the even stage second scan control signal are high voltage level;

as starting the scan of a frame, the odd stage scan start signal is provided to the gate of the forty-first transistor of the next to last stage GOA unit circuit, and meanwhile, the even stage scan start signal is provided to the gate of the forty-first transistor of the last stage GOA unit circuit; the backward scan of the odd stage GOA unit circuits and the backward scan of the even stage GOA unit circuits are performed at the same time.

Both the odd stage first scan control signal and the even stage first scan control signal are low voltage level, and both the odd stage second scan control signal and the even stage second scan control signal are high voltage level;

in a scanning period of the frame, the odd stage scan start signal is first provided to the gate of the forty-first transistor of the next to last stage GOA unit circuit, and after scan to all the odd stage GOA unit circuits is accomplished, the even stage scan start signal is provided to the gate of the forty-first transistor of the last stage GOA unit circuit; the backward scan of the odd stage GOA unit circuits and the backward scan of the even stage GOA unit circuits are performed in time division.

Both the odd stage first scan control signal and the even stage second scan control signal are high voltage level, and both the odd stage second scan control signal and the even stage first scan control signal are low voltage level;

as starting the scan of a frame, the odd stage scan start signal is provided to the gate of the eleventh transistor of the first stage GOA unit circuit, and meanwhile, the even stage scan start signal is provided to the gate of the forty-first transistor of the last stage GOA unit circuit; the forward scan of the odd stage GOA unit circuits and the backward scan of the even stage GOA unit circuits are performed at the same time.

Both the odd stage first scan control signal and the even stage second scan control signal are high voltage level, and both the odd stage second scan control signal and the even stage first scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the forty-first transistor of the last stage GOA unit circuit; the forward scan of the odd stage GOA unit circuits and the backward scan of the even stage GOA unit circuits are performed in time division.

Both the odd stage first scan control signal and the even stage first scan control signal are low voltage level, and both the odd stage second scan control signal and the even stage second scan control signal are high voltage level;

as starting the scan of a frame, the odd stage scan start signal is provided to the gate of the forty-first transistor of the next to last stage GOA unit circuit, and meanwhile, the even stage scan start signal is provided to the gate of the eleventh transistor of the second stage GOA unit circuit; the backward scan of the odd stage GOA unit circuits and the forward scan of the even stage GOA unit circuits are performed at the same time.

Both the odd stage first scan control signal and the even stage first scan control signal are low voltage level, and both the odd stage second scan control signal and the even stage second scan control signal are high voltage level;

in a scanning period of the frame, the odd stage scan start signal is first provided to the gate of the forty-first transistor of the next to last stage GOA unit circuit, and after scan to all the odd stage GOA unit circuits is accomplished, the even stage scan start signal is provided to the gate of the eleventh transistor of the second stage GOA unit circuit; the backward scan of the odd stage GOA unit circuits and the forward scan of the even stage GOA unit circuits are performed in time division.

The present invention further provides a gate driving circuit, comprising:

a plurality of GOA unit circuits, wherein respective odd stage GOA unit circuits are cascade connected, and respective even stage GOA unit circuits are cascade connected;

signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;

signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;

a common signal line, employed for providing a first low frequency clock signal and a second low frequency clock signal, located corresponding to all the GOA unit circuits;

the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;

N is set to be a positive integer and except the GOA unit circuits of the first, the second, the next to last and the last stages, in the Nth stage GOA unit circuit:

the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;

the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;

the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;

the pull-down holding module comprises: a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;

the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan;

wherein in the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal;

wherein both the odd stage first scan control signal and the even stage first scan control signal are high voltage level, and both the odd stage second scan control signal and the even stage second scan control signal are low voltage level;

as starting the scan of a frame, the odd stage scan start signal is provided to the gate of the eleventh transistor of the first stage GOA unit circuit, and meanwhile, the even stage scan start signal is provided to the gate of the eleventh transistor of the second stage GOA unit circuit; the forward scan of the odd stage GOA unit circuits and the forward scan of the even stage GOA unit circuits are performed at the same time.

The present invention further provides a gate driving circuit, comprising:

a plurality of GOA unit circuits, wherein respective odd stage GOA unit circuits are cascade connected, and respective even stage GOA unit circuits are cascade connected;

signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;

signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;

a common signal line, employed for providing a first low frequency clock signal and a second low frequency clock signal, located corresponding to all the GOA unit circuits;

the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;

N is set to be a positive integer and except the GOA unit circuits of the first, the second, the next to last and the last stages, in the Nth stage GOA unit circuit:

the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;

the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;

the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;

the pull-down holding module comprises: a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;

the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan;

wherein in the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal;

wherein both the odd stage first scan control signal and the even stage first scan control signal are high voltage level, and both the odd stage second scan control signal and the even stage second scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the eleventh transistor of the second stage GOA unit circuit; the forward scan of the odd stage GOA unit circuits and the forward scan of the even stage GOA unit circuits are performed in time division.

The benefits of the present invention are: the present invention provides a gate driving circuit, of which respective odd stage GOA unit circuits are cascade connected, and respective even stage GOA unit circuits are cascade connected; the odd stage first, second scan control signals, the odd stage scan start signal, the odd stage first, second high frequency clock signals are located corresponding to the odd stage GOA unit circuits; the even stage first, second scan control signals, the even stage scan start signal, the even stage first, second high frequency clock signals are located corresponding to the even stage GOA unit circuits; by controlling the voltage levels of the odd stage first, second scan control signals and even stage first, second scan control signals in cooperation with the odd stage scan start signal and the even stage scan start signal of different sequences, the odd stage GOA unit circuits and the even stage GOA unit circuits can be controlled to perform forward scan or backward scan at the same time or in time division to realize the variety of scans to promote the display quality for satisfying demands of various display products.

BRIEF DESCRIPTION OF THE DRAWINGS

The technical solution and the beneficial effects of the present invention are best understood from the following detailed description with reference to the accompanying figures and embodiments.

In drawings,

FIG. 9 is a sequence logic table as the odd stage GOA unit circuits and the even stage GOA unit circuits perform scan at the same time according to the gate driving circuit of the present invention;

FIG. 10 is a sequence logic table as the odd stage GOA unit circuits and the even stage GOA unit circuits perform scan in time division according to the gate driving circuit of the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
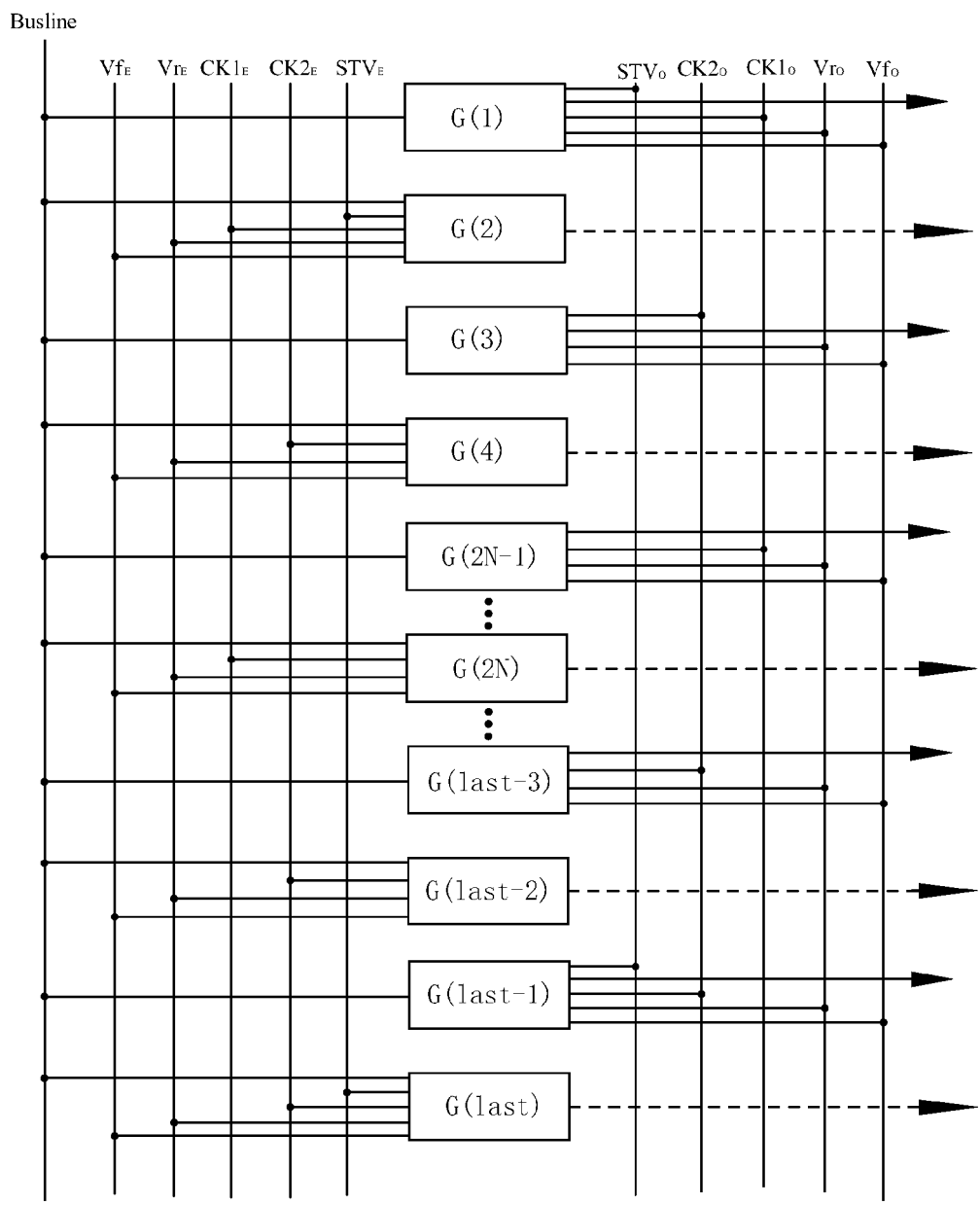
FIG. 1 is a multi-stage structure diagram of a gate driving circuit according to the present invention.
Figure 2:
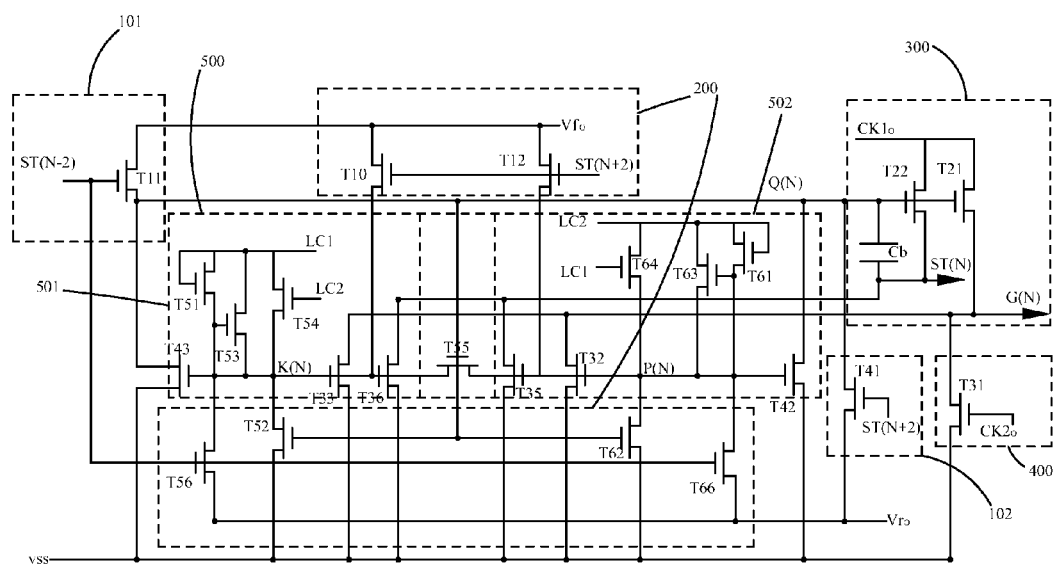
FIG. 2 is a circuit diagram of an odd stage GOA unit circuit according to the gate driving circuit of the present invention.
Figure 3:
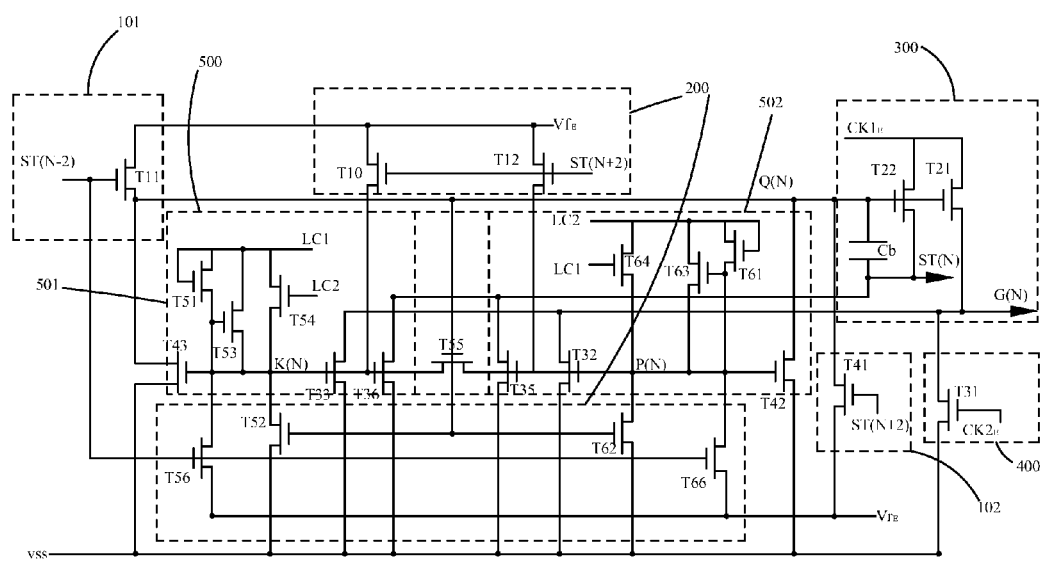
FIG. 3 is a circuit diagram of an even stage GOA unit circuit according to the gate driving circuit of the present invention.
Figure 4:
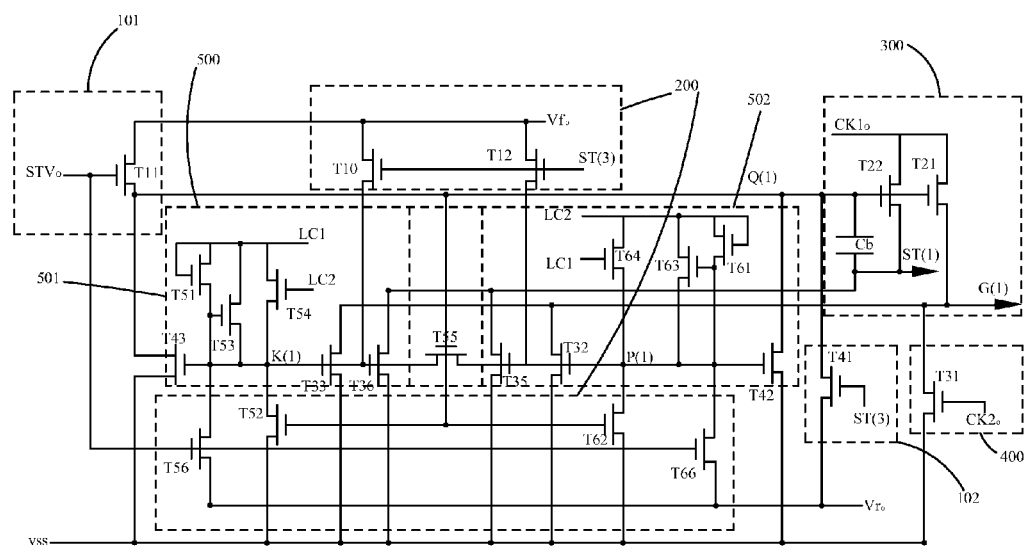
FIG. 4 is a circuit diagram of a first stage GOA unit circuit according to the gate driving circuit of the present invention.
Figure 5:
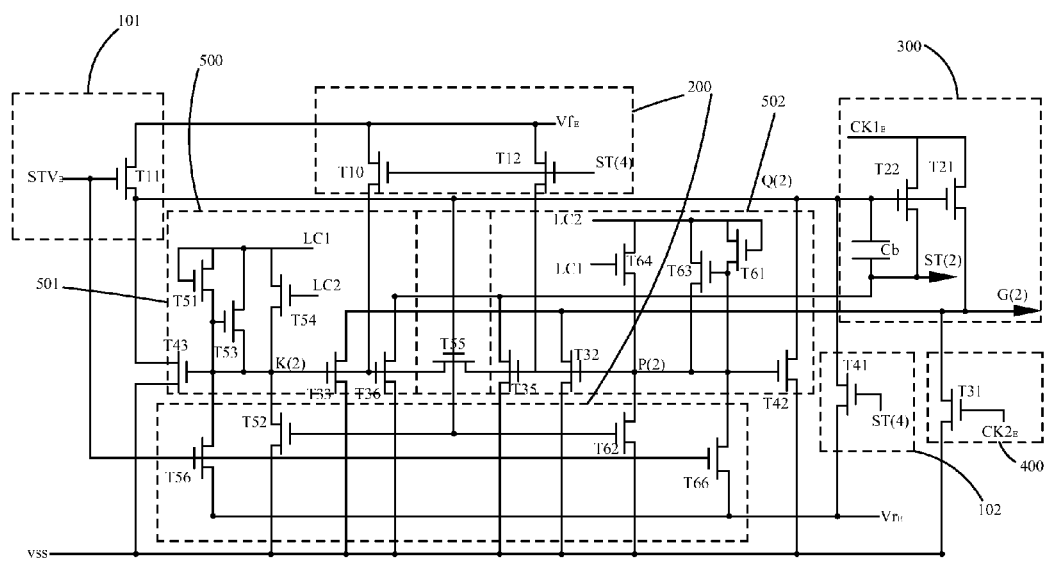
FIG. 5 is a circuit diagram of a second stage GOA unit circuit according to the gate driving circuit of the present invention.
Figure 6:
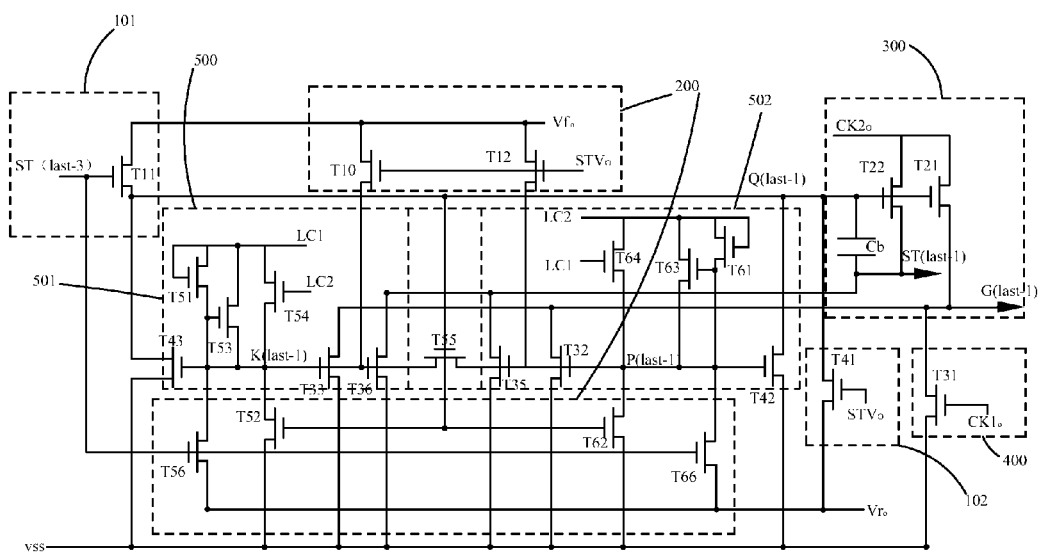
FIG. 6 is a circuit diagram of a next to last stage GOA unit circuit according to the gate driving circuit of the present invention.
Figure 7:
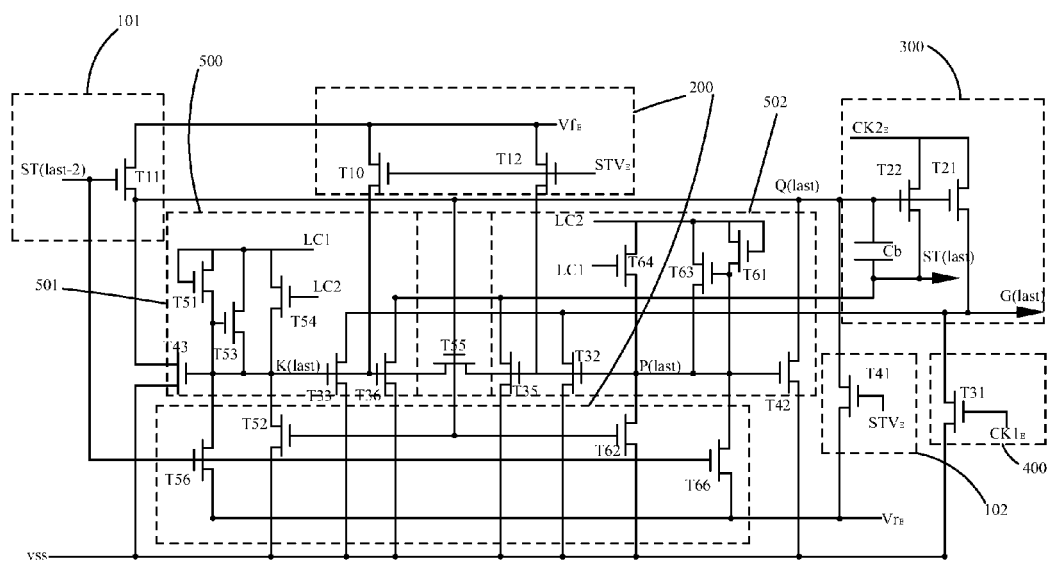
FIG. 7 is a circuit diagram of a last stage GOA unit circuit according to the gate driving circuit of the present invention.

Please refer from FIG. 1 to FIG. 3. The present invention provides a gate driving circuit. As shown in FIG. 1, the gate driving circuit of the present invention comprises:

a plurality of GOA unit circuits, wherein respective odd stage GOA unit circuits are cascade connected, and respective even stage GOA unit circuits are cascade connected;

signal lines respectively employed for providing an odd stage first scan control signal $Vf_O$, an odd stage second scan control signal $Vr_O$, an odd stage scan start signal $STV_O$, an odd stage first high frequency clock signal $CK1_O$, an odd stage second high frequency clock signal $CK2_O$, located corresponding to the odd stage GOA unit circuits;

signal lines respectively employed for providing an even stage first scan control signal $Vf_E$, an even stage second scan control signal $Vr_E$, an even stage scan start signal $STV_E$, an even stage first high frequency clock signal $CK1_E$, an even stage second high frequency clock signal $CK2_E$, located corresponding to the even stage GOA unit circuits;

a common signal line Busline, employed for providing a first low frequency clock signal LC1 and a second low frequency clock signal LC2, located corresponding to all the GOA unit circuits.

As shown in FIG. 2, FIG. 3, the GOA unit circuit of every stage comprises a forward-backward scan control module, a transfer regulation module 200, an output module 300, a first pull-down module 400 and a pull-down holding module 500; the forward-backward scan control module further comprises a first controlling module 101, and a second controlling module 102.

N is set to be a positive integer and except the GOA unit circuits of the first, the second, the next to last and the last stages, in the Nth stage GOA unit circuit:

the first controlling module 101 comprises: an eleventh transistor T11, and a gate of the eleventh transistor T11 is electrically coupled to a stage transfer signal ST(N−2) of the N−2th stage GOA unit circuit, and a drain is electrically coupled to a first node Q(N), and as N is an odd number, a source is electrically coupled to the odd stage first scan control signal $Vf_O$, and as N is an even number, the source is electrically coupled to the even stage first scan control signal $Vf_E$.

The second controlling module 102 comprises: a forty-first transistor T41, and a gate of the forty-first transistor T41 is electrically coupled to a stage transfer signal ST(N+2) of the N+2th stage GOA unit circuit, and a drain is electrically coupled to the first node Q(N), and as N is an odd number, a source is electrically coupled to the odd stage second scan control signal $Vr_O$, and as N is an even number, the source is electrically coupled to the even stage second scan control signal $Vr_E$.

The output module 300 comprises: a twenty-first transistor T21, and a gate of the twenty-first transistor T21 is electrically coupled to the first node Q(N), and a drain outputs a scan signal G(N), and as N is an odd number, a source is electrically coupled to the odd stage first high frequency clock signal $CK1_O$, and as N is an even number, the source is electrically coupled to the even stage first high frequency clock signal $CK1_E$; a twenty-second transistor T22, and a gate of the twenty-second transistor T22 is electrically coupled to the first node Q(N), and a drain outputs a stage transfer signal ST(N), and as N is an odd number, a source is electrically coupled to the odd stage first high frequency clock signal $CK1_O$, and as N is an even number, the source is electrically coupled to the even stage first high frequency clock signal $CK1_E$; a capacitor Cb, and one end of the capacitor Cb is electrically coupled to the first node Q(N), and the other end is electrically coupled to the stage transfer signal ST(N).

The pull-down holding module 500 comprises: a fifty-fifth transistor T55, a first pull-down holding module 501 and a second pull-down holding module 502.

A gate of the fifty-fifth transistor T55 is electrically coupled to the first node Q(N), and a source is electrically coupled to a second node K(N), and a drain is electrically coupled to a third node P(N).

The first pull-down holding module 501 comprises: a thirty-third transistor T33, and a gate of the thirty-third transistor T33 is electrically coupled to a second node K(N), and a source is electrically coupled to the scan signal G(N), and a drain is electrically coupled to a constant low voltage level VSS; a thirty-sixth transistor T36, and a gate of the thirty-sixth transistor T36 is electrically coupled to the second node K(N), and a source is electrically coupled to the stage transfer signal ST(N), and a drain is electrically coupled to the constant low voltage level VSS; a forty-third transistor T43, and a gate of the forty-third transistor T43 electrically coupled to the second node K(N), and a source is electrically coupled to the first node Q(N), and a drain is electrically coupled to the constant low voltage level VSS; a fifty-first transistor T51, and both a gate and a source of the fifty-first transistor T51 are electrically coupled to the first low frequency clock signal LC1, and a drain is electrically coupled to a gate of a fifty-third transistor T53; the fifty-third transistor T53, and the gate of the fifty-third transistor T53 is electrically coupled to the drain of the fifty-first transistor T51, and a source is electrically coupled to the first low frequency clock signal LC1, and a drain is electrically coupled to the second node K(N); a fifty-fourth transistor T54, and a gate of the fifty-fourth transistor T54 is electrically coupled to the second low frequency clock signal LC2, and a source is electrically coupled to the first low frequency clock signal LC1, and a drain is electrically coupled to the second node K(N).

The second pull-down holding module 502 comprises a thirty-second transistor T32, and a gate of the thirty-second transistor T32 is electrically coupled to the third node P(N), and a source is electrically coupled to the scan signal G(N), and a drain is electrically coupled to the constant low voltage level VSS; a thirty-fifth transistor T35, and a gate of the thirty-fifth transistor T35 is electrically coupled to the third node P(N), and a source is electrically coupled to the stage transfer signal ST(N), and a drain is electrically coupled to the constant low voltage level VSS; a forty-second transistor T42, and a gate of the forty-second transistor T42 is electrically coupled to the third node P(N), and a source is electrically coupled to the first node Q(N), and a drain is electrically coupled to the constant low voltage level VSS; a sixty-first transistor T61, and both a gate and a source of the sixty-first transistor T61 are electrically coupled to the second low frequency clock signal LC2, and a drain is electrically coupled to a gate of a sixty-third transistor T63; the sixty-third transistor T63, and the gate of the sixty-third transistor T63 is electrically coupled to the drain of the sixty-first transistor T61, and a source is electrically coupled to the second low frequency clock signal LC2, and a drain is electrically coupled to the third node P(N); a sixty-fourth transistor T64, and a gate of the sixty-fourth transistor T64 is electrically coupled to the first low frequency clock signal LC1, and a source is electrically coupled to the second low frequency clock signal LC2, and a drain is electrically coupled to the third node P(N).

The transfer regulation module 200 comprises a fifty-second transistor T52, and a gate of the fifty-second transistor T52 is electrically coupled to the first node Q(N), and a source is electrically coupled to the second node K(N), and a drain is electrically coupled to the constant low voltage level VSS; a sixty-second transistor T62, and a gate of the sixty-second transistor T62 is electrically coupled to the first node Q(N), and a source is electrically coupled to the third node P(N), and a drain is electrically coupled to the constant low voltage level VSS; a tenth transistor T10, and a gate of the tenth transistor T10 is electrically coupled to the stage transfer signal ST(N+2) of the N+2th stage GOA unit circuit, and a drain is electrically coupled to the second node K(N), and as N is an odd number, a source is electrically coupled to the odd stage first scan control signal $Vf_O$, and as N is an even number, the source is electrically coupled to the even stage first scan control signal $Vf_E$; a twelfth transistor T12, and a gate of the twelfth transistor T12 is electrically coupled to the stage transfer signal ST(N+2) of the N+2th stage GOA unit circuit, and a drain is electrically coupled to the third node P(N), and as N is an odd number, a source is electrically coupled to the odd stage first scan control signal $Vf_O$, and as N is an even number, the source is electrically coupled to the even stage first scan control signal $Vf_E$; a fifty-sixth transistor T56, and a gate of the fifty-sixth transistor T56 is electrically coupled to the stage transfer signal ST(N−2) of the N−2th stage GOA unit circuit, and a source is electrically coupled to the drain of the fifty-first transistor T51 and the second node K(N), and as N is an odd number, a drain is electrically coupled to the odd stage second scan control signal $Vr_O$, and as N is an even number, the drain is electrically coupled to the even stage second scan control signal $Vr_E$; a sixty-sixth transistor T66, and a gate of the sixty-sixth transistor T66 is electrically coupled to the stage transfer signal ST(N−2) of the N−2th stage GOA unit circuit, and a source is electrically coupled to the drain of the sixty-first transistor T61 and the third node P(N), and as N is an odd number, a drain is electrically coupled to the odd stage second scan control signal $Vr_O$, and as N is an even number, the drain is electrically coupled to the even stage second scan control signal $Vr_E$.

The first pull-down module 400 comprises a thirty-first transistor T31, and a source is electrically coupled to the scan signal G(N), and a drain is electrically coupled to the constant low voltage level VSS, and as N is an odd number, a gate of the thirty-first transistor T31 is electrically coupled to the odd stage second high frequency clock signal $CK2_O$, and as N is an even number, the gate of the thirty-first transistor T31 is electrically coupled to the even stage second high frequency clock signal $CK2_E$.

As N is an odd number, in the N+2th stage GOA unit circuit, both the source of the twenty-first transistor T21 and the source of the twenty-second transistor T22 are electrically coupled to the odd stage second high frequency clock signal $CK2_O$, and the gate of the thirty-first transistor T31 is electrically coupled to the odd stage first high frequency clock signal $CK1_O$.

As N is an even number, in the N+2th stage GOA unit circuit, both the source of the twenty-first transistor T21 and the source of the twenty-second transistor T22 are electrically coupled to the even stage second high frequency clock signal $CK2_E$, and the gate of the thirty-first transistor T31 is electrically coupled to the even stage first high frequency clock signal $CK1_E$.

Furthermore, the odd stage GOA unit circuits and the even stage GOA unit circuits perform scan of the gate driving circuit according to the present invention can respectively perform forward scan or backward scan. The first controlling module 101 functions for pull-up control in forward scan, and functions for pull-down in backward scan; the second controlling module 102 functions for pull-up control in backward scan, and functions for pull-down in forward scan. As the odd stage first scan control signal $Vf_O$ is high voltage level and the odd stage second scan control signal $Vr_O$ is low voltage level, the odd stage GOA unit circuits are controlled to perform forward scan; as the odd stage first scan control signal $Vf_O$ is low voltage level and the odd stage second scan control signal $Vr_O$ is high voltage level, the odd stage GOA unit circuits are controlled to perform backward scan. As the even stage first scan control signal VfE is high voltage level and the even stage second scan control signal $Vr_E$ is low voltage level, the even stage GOA unit circuit is controlled to perform forward scan; as the even stage first scan control signal $Vf_E$ is low voltage level and the even stage second scan control signal $Vr_E$ is high voltage level, the even stage GOA unit circuit is controlled to perform backward scan.

The first low frequency clock signal LC1 and the second low frequency clock signal LC2 are inverse in phase to control the first pull-down holding module 501, and the second pull-down holding module 502 to alternately function.

Particularly, respectively referring to FIG. 4, FIG. 5, FIG. 6 and FIG. 7, in the first stage connection of the gate driving circuit, all the gate of the eleventh transistor T11, the gate of the fifty-sixth transistor T56, and the gate of the sixty-sixth transistor T66 are electrically coupled to the odd stage scan start signal $STV_O$; both the source of the twenty-first transistor T21 and the source of the twenty-second transistor T22 are electrically coupled to the odd stage first high frequency clock signal $CK1_O$, and the gate of the thirty-first transistor T31 is electrically coupled to the odd stage second high frequency clock signal $CK2_O$.

In the second stage connection of the gate driving circuit, all the gate of the eleventh transistor T11, the gate of the fifty-sixth transistor T56, and the gate of the sixty-sixth transistor T66 are electrically coupled to the even stage scan start signal $STV_E$; both the source of the twenty-first transistor T21 and the source of the twenty-second transistor T22 are electrically coupled to the even stage first high frequency clock signal $CK1_E$, and the gate of the thirty-first transistor T31 is electrically coupled to the even stage second high frequency clock signal $CK2_E$.

In the next to last stage connection of the gate driving circuit, all the gate of the forty-first transistor T41, the gate of the tenth transistor T10, and the gate of the twelfth transistor T12 are electrically coupled to the odd stage scan start signal $STV_O$; both the source of the twenty-first transistor T21 and the source of the twenty-second transistor T22 are electrically coupled to the odd stage second high frequency clock signal $CK2_O$, and the gate of the thirty-first transistor T31 is electrically coupled to the odd stage first high frequency clock signal $CK1_O$.

In the last stage connection of the gate driving circuit, all the gate of the forty-first transistor T41, the gate of the tenth transistor T10, and the gate of the twelfth transistor T12 are electrically coupled to the even stage scan start signal $STV_E$; both the source of the twenty-first transistor T21 and the source of the twenty-second transistor T22 are electrically coupled to the even stage second high frequency clock signal $CK2_E$, and the gate of the thirty-first transistor T31 is electrically coupled to the even stage first high frequency clock signal $CK1_E$.

Figure 8:
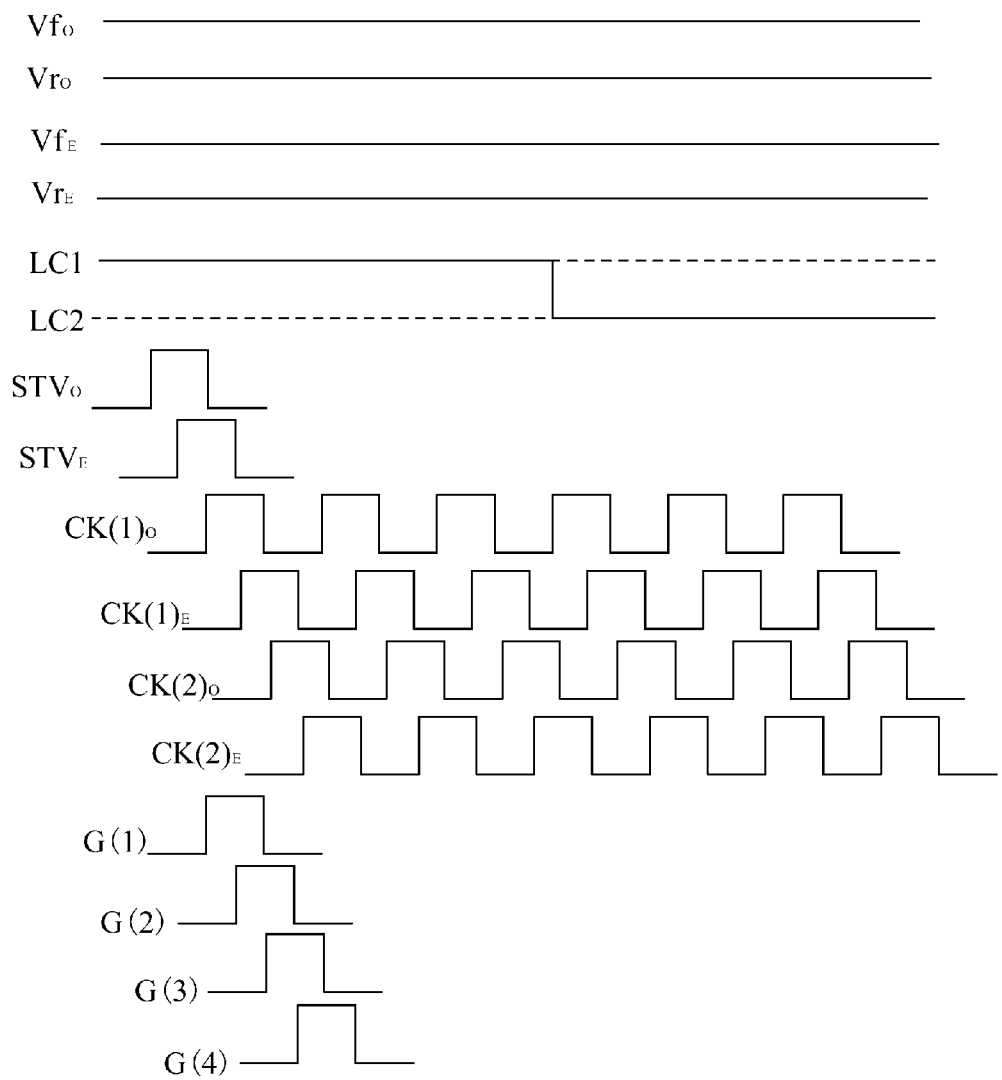
FIG. 8 is a sequence diagram of forward scan according to the gate driving circuit of the present invention.

Please refer to FIG. 2 combining with FIG. 8. The specific procedure that the odd stage GOA unit circuit of the gate driving circuit according to the present invention performs forward scan is: the odd stage first scan control signal $Vf_O$ is high voltage level and the odd stage second scan control signal $Vr_O$ is low voltage level, the odd stage scan start signal $STV_O$ is provided to the first stage GOA unit circuit. N is set to be an odd number, and the Nth stage GOA unit circuit receives the stage transfer signal ST(N−2) from the N−2th stage GOA unit circuit. As the stage transfer signal ST(N−2) of the N−2th stage GOA unit circuit is high voltage level, the eleventh transistor T11 is activated, and the odd stage first scan control signal $Vf_O$ charges the first node Q(N), and then, the eleventh transistor T11 transmits the odd stage first scan control signal $Vf_O$ to the first node Q(N); meanwhile, the fifty-sixth transistor T56 and the sixty-sixth transistor T66 are activated to pull down the voltage levels of the second node K(N) and the third node P(N) to the odd stage second scan control signal $Vr_O$; along with that the first node Q(N) is charged to be high voltage level, the fifty-second transistor T52, the fifty-fifth transistor T55, and the sixty-second transistor T62 are activated to further pull down the voltage levels of the second node K(N) and the third node P(N) to the constant low voltage level VSS, and with twice pull-downs, the second node K(N) and the third node P(N) can be kept to be low voltage level better to avoid the influence to the output of the scan signal G(N); all the thirty-second transistor T32, the thirty-third transistor T33, the thirty-fifth transistor T35, the thirty-sixth transistor T36, the forty-first transistor T41, the forty-second transistor T42 and the forty-third transistor T43 are deactivated, and in the meantime, the twenty-first transistor T21 and the twenty-second transistor T22 which are also controlled by the voltage level of the first node Q(N) are activated, and then the odd stage first high frequency clock signal $CK1_O$ is low voltage level, and the odd stage second high frequency clock signal $CK2_O$ is high voltage level, and the thirty-first transistor T31 is activated to pull down the scan signal G(N) to the constant low voltage level VSS, and the scan signal G(N) outputs low voltage level.

Next, the stage transfer signal ST(N−2) from the N−2th stage GOA unit circuit becomes low voltage level, and the eleventh transistor T11 is deactivated, and the first node Q(N) remains to be high voltage level, and the odd stage first high frequency clock signal $CK1_O$ becomes high voltage level, and the odd stage second high frequency clock signal $CK2_O$ becomes low voltage level, and the scan signal G(N) and the stage transfer signal ST(N) output high voltage levels; with the coupling of the capacitor Cb, the first node Q(N) is raised to be higher voltage level, and the gate-source voltages Vgs of the twenty-first transistor T21 and the twenty-second transistor T22 basically hold still for ensuring the smooth output of the scan signal G(N); then, the fifty-fifth transistor T55, the fifty-second transistor T52, and the sixty-second transistor T62 remain to be activated to pull down the voltage levels of the second node K(N) and the third node P(N), and the thirty-first transistor T31 is deactivated, and all the thirty-second transistor T32, the thirty-third transistor T33, the thirty-fifth transistor T35, the thirty-sixth transistor T36, the forty-second transistor T42 and the forty-third transistor T43 are deactivated.

After that, the odd stage first high frequency clock signal $CK1_O$ becomes low voltage level, and the odd stage second high frequency clock signal $CK2_O$ becomes high voltage level, and the thirty-first transistor T31 is activated to pull down the scan signal G(N); the stage transfer signal ST(N+2) of the N+2th stage GOA unit circuit is high voltage level, and the forty-first transistor T41 is activated to pull down the voltage level of the first node Q(N) to the odd stage second scan control signal $Vr_O$; the tenth transistor T10 and the twelfth transistor T12 are activated to pull up the voltage levels of the second node K(N) and the third node P(N) to the odd stage first scan control signal $Vf_O$; subsequently, the fifty-fifth transistor T55, the fifty-second transistor T52, and the sixty-second transistor T62 are deactivated; the thirty-second transistor T32, the thirty-third transistor T33, the thirty-fifth transistor T35, the thirty-sixth transistor T36, the forty-second transistor T42 and the forty-third transistor T43 are activated, and the voltage levels of the first node Q(N), the scan signal G(N), and the stage transfer signal ST(N) are pulled down to the constant low voltage level VSS.

Then, in the rest time of showing a frame of an image, the first low frequency clock signal LC1 and the second low frequency clock signal LC2 alternately provide high voltage level to control the first pull-down holding module 501 and the second pull-down holding module 502 to function for respectively charging the second node K(N) or the third node P(N) to maintain the first node Q(N) and the scan signal G(N) to be low voltage level.

The specific procedure that the odd stage GOA unit circuit of the gate driving circuit according to the present invention performs forward scan is: the odd stage first scan control signal $Vf_O$ is low voltage level and the odd stage second scan control signal $Vr_O$ is high voltage level, the odd stage scan start signal STVO is provided to the next to last stage GOA unit circuit. N is set to be an odd number, and as the N+2th stage GOA unit circuit provides the stage transfer signal ST(N+2) of high voltage level to the forty-first transistor T41, the forty-first transistor T41 is activated, and the odd stage second scan control signal $Vr_O$ charges the first node Q(N), and unlike the forward scan, here, the forty-first transistor T41 transmits the odd stage second scan control signal $Vr_O$ to the first node Q(N); meanwhile, the tenth transistor T10 and the twelfth transistor T12 are activated to pull down the voltage levels of the second node K(N) and the third node P(N) to the odd stage first scan control signal $Vf_O$ of low voltage level; along with that the first node Q(N) is charged to be high voltage level, the fifty-second transistor T52, the fifty-fifth transistor T55, and the sixty-second transistor T62 are activated to further pull down the voltage levels of the second node K(N) and the third node P(N) to the constant low voltage level VSS; all the thirty-second transistor T32, the thirty-third transistor T33, the thirty-fifth transistor T35, the thirty-sixth transistor T36, the forty-first transistor T41, the forty-second transistor T42 and the forty-third transistor T43 are deactivated; in the meantime, the twenty-first transistor T21 and the twenty-second transistor T22 which are also controlled by the voltage level of the first node Q(N) are activated, and the odd stage first high frequency clock signal $CK1_O$ is low voltage level, and the odd stage second high frequency clock signal $CK2_O$ is high voltage level, and the thirty-first transistor T31 is activated to pull down the scan signal G(N) to the constant low voltage level VSS, and the scan signal G(N) outputs low voltage level.

Next, the stage transfer signal ST(N+2) from the N+2th stage GOA unit circuit becomes low voltage level, and the forty-first transistor T41 is deactivated, and the first node Q(N) remains to be high voltage level, and the odd stage first high frequency clock signal $CK1_O$ becomes high voltage level, and the odd stage second high frequency clock signal $CK2_O$ becomes low voltage level, and the scan signal G(N) and the stage transfer signal ST(N) output high voltage levels; with the coupling of the capacitor Cb, the first node Q(N) is raised to be higher voltage level, and both the gate-source voltages Vgs of the twenty-first transistor T21 and the twenty-second transistor T22 hold still for ensuring the smooth output of the scan signal G(N); then, the fifty-fifth transistor T55, the fifty-second transistor T52, and the sixty-second transistor T62 remain to be activated to pull down the voltage levels of the second node K(N) and the third node P(N), and the thirty-first transistor T31 is deactivated, and all the thirty-second transistor T32, the thirty-third transistor T33, the thirty-fifth transistor T35, the thirty-sixth transistor T36, the forty-second transistor T42 and the forty-third transistor T43 are deactivated.

After that, the odd stage first high frequency clock signal $CK1_O$ becomes low voltage level, and the odd stage second high frequency clock signal $CK2_O$ becomes high voltage level, and the thirty-first transistor T31 is activated to pull down the scan signal G(N); the stage transfer signal ST(N−2) of the N−2th stage GOA unit circuit is high voltage level, and the eleventh transistor T11 is activated to pull down the voltage level of the first node Q(N) to the odd stage second scan control signal $Vr_O$; the fifty-sixth transistor T56 and the sixty-sixth transistor T66 are activated to pull up the voltage levels of the second node K(N) and the third node P(N) to the odd stage first scan control signal $Vf_O$; subsequently, the fifty-fifth transistor T55, the fifty-second transistor T52, and the sixty-second transistor T62 are deactivated; all the thirty-second transistor T32, the thirty-third transistor T33, the thirty-fifth transistor T35, the thirty-sixth transistor T36, the forty-second transistor T42 and the forty-third transistor T43 are activated, and the voltage levels of the first node Q(N), the scan signal G(N), and the stage transfer signal ST(N) are pulled down to the constant low voltage level VSS.

Then, in the rest time of showing a frame of an image, the first low frequency clock signal LC1 and the second low frequency clock signal LC2 alternately provide high voltage level to control the first pull-down holding module 501 and the second pull-down holding module 502 to function for respectively charging the second node K(N) or the third node P(N) to maintain the first node Q(N) and the scan signal G(N) to be low voltage level.

Please refer FIG. 3 combining with FIG. 8. As the even stage GOA unit circuit of the gate driving circuit according to the present invention performs forward scan or backward scan, the corresponding control signals have to be replaced with the even stage first scan control signal $Vf_E$, the even stage second scan control signal $Vr_E$, the even stage scan start signal $STV_E$, the even stage first high frequency clock signal $CK1_E$, and the even stage second high frequency clock signal $CK2_E$. The forward scan starts from the second stage GOA unit circuit, and the backward scan starts from the last stage GOA unit circuit, and the specific working procedure is the same as the working procedure that the aforesaid odd stage GOA unit circuit performs forward scan or backward scan. The repeated description is omitted here.

Please refer to FIG. 9. The gate driving circuit of the present invention can perform forward scan or backward scan of the odd stage GOA unit circuits and the even stage GOA unit circuits at the same time as follows:

corresponding to the logic signal 11 in FIG. 9, the forward scan of the odd stage GOA unit circuits and the forward scan of the even stage GOA unit circuits are performed at the same time. Specifically, both the odd stage first scan control signal $Vf_O$ and the even stage first scan control signal $Vf_E$ are high voltage level, and both the odd stage second scan control signal $Vr_O$ and the even stage second scan control signal $Vr_E$ are low voltage level; as starting the scan of a frame, the odd stage scan start signal $STV_O$ is provided to the gate of the eleventh transistor T11 of the first stage GOA unit circuit, and meanwhile, the even stage scan start signal $STV_E$ is provided to the gate of the eleventh transistor T11 of the second stage GOA unit circuit.

Corresponding to the logic signal 00 in FIG. 9, the backward scan of the odd stage GOA unit circuits and the backward scan of the even stage GOA unit circuits are performed at the same time. Specifically, both the odd stage first scan control signal $Vf_O$ and the even stage first scan control signal $Vf_E$ are low voltage level, and both the odd stage second scan control signal $Vr_O$ and the even stage second scan control signal $Vr_E$ are high voltage level; as starting the scan of a frame, the odd stage scan start signal $STV_O$ is provided to the gate of the forty-first transistor T41 of the next to last stage GOA unit circuit, and meanwhile, the even stage scan start signal $STV_E$ is provided to the gate of the forty-first transistor T41 of the last stage GOA unit circuit.

Corresponding to the logic signal 10 in FIG. 9, the forward scan of the odd stage GOA unit circuits and the backward scan of the even stage GOA unit circuits are performed at the same time. Specifically, both the odd stage first scan control signal $Vf_O$ and the even stage second scan control signal $Vr_E$ are high voltage level, and both the odd stage second scan control signal $Vr_O$ and the even stage first scan control signal $Vf_E$ are low voltage level; as starting the scan of a frame, the odd stage scan start signal $STV_O$ is provided to the gate of the eleventh transistor T11 of the next to last stage GOA unit circuit, and meanwhile, the even stage scan start signal $STV_E$ is provided to the gate of the forty-first transistor T41 of the last stage GOA unit circuit.

Corresponding to the logic signal 01 in FIG. 9, the backward scan of the odd stage GOA unit circuits and the forward scan of the even stage GOA unit circuits are performed at the same time. Specifically, both the odd stage first scan control signal $Vf_o$ and the even stage second scan control signal $Vr_E$ are low voltage level, and both the odd stage second scan control signal $Vr_O$ and the even stage first scan control signal $Vf_E$ are high voltage level; as starting the scan of a frame, the odd stage scan start signal $STV_O$ is provided to the gate of the forty-first transistor T41 of the next to last stage GOA unit circuit, and meanwhile, the even stage scan start signal $STV_E$ is provided to the gate of the eleventh transistor T11 of the last stage GOA unit circuit.

Please refer to FIG. 10. The gate driving circuit of the present invention can perform forward scan or backward scan of the odd stage GOA unit circuits and the even stage GOA unit circuits in time division as follows:

corresponding to the logic signal 1_1 in FIG. 10, the forward scan of the odd stage GOA unit circuits and the forward scan of the even stage GOA unit circuits are performed in time division. Specifically, both the odd stage first scan control signal $Vf_O$ and the even stage first scan control signal $Vf_E$ are high voltage level, and both the odd stage second scan control signal $Vr_O$ and the even stage second scan control signal $Vr_E$ are low voltage level; in a scanning period of the frame, the odd stage scan start signal $STV_O$ is first provided to the gate of the eleventh transistor T11 of the first stage GOA unit circuit, and after scan to all the odd stage GOA unit circuits is accomplished, the even stage scan start signal $STV_E$ is provided to the gate of the eleventh transistor T11 of the second stage GOA unit circuit.

Corresponding to the logic signal 0_0 in FIG. 10, the backward scan of the odd stage GOA unit circuits and the backward scan of the even stage GOA unit circuits are performed in time division. Specifically, both the odd stage first scan control signal $Vf_O$ and the even stage first scan control signal $Vf_E$ are low voltage level, and both the odd stage second scan control signal $Vr_O$ and the even stage second scan control signal $Vr_E$ are high voltage level; in a scanning period of the frame, the odd stage scan start signal $STV_O$ is first provided to the gate of the forty-first transistor T41 of the next to last stage GOA unit circuit, and after scan to all the odd stage GOA unit circuits is accomplished, the even stage scan start signal $STV_E$ is provided to the gate of the forty-first transistor T41 of the last stage GOA unit circuit.

Corresponding to the logic signal 1_0 in FIG. 10, the forward scan of the odd stage GOA unit circuits and the backward scan of the even stage GOA unit circuits are performed in time division. Specifically, both the odd stage first scan control signal $Vf_O$ and the even stage second scan control signal $Vr_E$ are high voltage level, and both the odd stage second scan control signal $Vr_O$ and the even stage first scan control signal $Vf_E$ are high voltage level; in a scanning period of the frame, the odd stage scan start signal $STV_O$ is provided to the gate of the eleventh transistor T11 of the next to last stage GOA unit circuit, and after scan to all the odd stage GOA unit circuits is accomplished, the even stage scan start signal $STV_E$ is provided to the gate of the forty-first transistor T41 of the last stage GOA unit circuit.

Corresponding to the logic signal 0_1 in FIG. 10, the backward scan of the odd stage GOA unit circuits and the forward scan of the even stage GOA unit circuits are performed in time division. Specifically, both the odd stage first scan control signal $Vf_O$ and the even stage second scan control signal $Vr_E$ are low voltage level, and both the odd stage second scan control signal $Vr_O$ and the even stage first scan control signal $Vf_E$ are high voltage level; in a scanning period of the frame, the odd stage scan start signal $STV_O$ is first provided to the gate of the forty-first transistor T41 of the next to last stage GOA unit circuit, and after scan to all the odd stage GOA unit circuits is accomplished, the even stage scan start signal $STV_E$ is provided to the gate of the eleventh transistor T11 of the second stage GOA unit circuit.

In conclusion, the present invention provides a gate driving circuit, of which respective odd stage GOA unit circuits are cascade connected, and respective even stage GOA unit circuits are cascade connected; the odd stage first, second scan control signals, the odd stage scan start signal, the odd stage first, second high frequency clock signals are located corresponding to the odd stage GOA unit circuits; the even stage first, second scan control signals, the even stage scan start signal, the even stage first, second high frequency clock signals are located corresponding to the even stage GOA unit circuits; by controlling the voltage levels of the odd stage first, second scan control signals and even stage first, second scan control signals in cooperation with the odd stage scan start signal and the even stage scan start signal of different sequences, the odd stage GOA unit circuits and the even stage GOA unit circuits can be controlled to perform forward scan or backward scan at the same time or in time division to realize the variety of scans to promote the display quality for satisfying demands of various display products.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A gate driving circuit, comprising:
a plurality of GOA unit circuits, wherein respective odd stage GOA unit circuits are cascade connected, and respective even stage GOA unit circuits are cascade connected;
signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;
signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;
a common signal line, employed for providing a first low frequency clock signal and a second low frequency clock signal, located corresponding to all the GOA unit circuits;
the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;
N is set to be a positive integer and except the GOA unit circuits of the first, the second, the next to last and the last stages, in the Nth stage GOA unit circuit:
the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;
the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;
the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;
the pull-down holding module comprises: a fifty-fifth transistor, a first pull-down holding module and a second pull-down holding module;
a gate of the fifty-fifth transistor is electrically coupled to the first node, and a source is electrically coupled to a second node, and a drain is electrically coupled to a third node;
the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;
the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan.

2. The gate driving circuit according to claim 1, wherein in the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal.

3. The gate driving circuit according to claim 2, wherein both the odd stage first scan control signal and the even stage first scan control signal are high voltage level, and both the odd stage second scan control signal and the even stage second scan control signal are low voltage level;

as starting the scan of a frame, the odd stage scan start signal is provided to the gate of the eleventh transistor of the first stage GOA unit circuit, and meanwhile, the even stage scan start signal is provided to the gate of the eleventh transistor of the second stage GOA unit circuit; the forward scan of the odd stage GOA unit circuits and the forward scan of the even stage GOA unit circuits are performed at the same time.

4. The gate driving circuit according to claim 2, wherein both the odd stage first scan control signal and the even stage first scan control signal are high voltage level, and both the odd stage second scan control signal and the even stage second scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the eleventh transistor of the second stage GOA unit circuit; the forward scan of the odd stage GOA unit circuits and the forward scan of the even stage GOA unit circuits are performed in time division.

5. The gate driving circuit according to claim 2, wherein both the odd stage first scan control signal and the even stage first scan control signal are low voltage level, and both the odd stage second scan control signal and the even stage second scan control signal are high voltage level;

as starting the scan of a frame, the odd stage scan start signal is provided to the gate of the forty-first transistor of the next to last stage GOA unit circuit, and meanwhile, the even stage scan start signal is provided to the gate of the forty-first transistor of the last stage GOA unit circuit; the backward scan of the odd stage GOA unit circuits and the backward scan of the even stage GOA unit circuits are performed at the same time.

6. The gate driving circuit according to claim 2, wherein both the odd stage first scan control signal and the even stage first scan control signal are low voltage level, and both the odd stage second scan control signal and the even stage second scan control signal are high voltage level;

in a scanning period of the frame, the odd stage scan start signal is first provided to the gate of the forty-first transistor of the next to last stage GOA unit circuit, and after scan to all the odd stage GOA unit circuits is accomplished, the even stage scan start signal is provided to the gate of the forty-first transistor of the last stage GOA unit circuit; the backward scan of the odd stage GOA unit circuits and the backward scan of the even stage GOA unit circuits are performed in time division.

7. The gate driving circuit according to claim 2, wherein both the odd stage first scan control signal and the even stage second scan control signal are high voltage level, and both the odd stage second scan control signal and the even stage first scan control signal are low voltage level;

as starting the scan of a frame, the odd stage scan start signal is provided to the gate of the eleventh transistor of the first stage GOA unit circuit, and meanwhile, the even stage scan start signal is provided to the gate of the forty-first transistor of the last stage GOA unit circuit; the forward scan of the odd stage GOA unit circuits and the backward scan of the even stage GOA unit circuits are performed at the same time.

8. The gate driving circuit according to claim 2, wherein both the odd stage first scan control signal and the even stage second scan control signal are high voltage level, and both the odd stage second scan control signal and the even stage first scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the forty-first transistor of the last stage GOA unit circuit; the forward scan of the odd stage GOA unit circuits and the backward scan of the even stage GOA unit circuits are performed in time division.

9. The gate driving circuit according to claim 2, wherein both the odd stage first scan control signal and the even stage second scan control signal are low voltage level, and both the odd stage second scan control signal and the even stage first scan control signal are high voltage level;

as starting the scan of a frame, the odd stage scan start signal is provided to the gate of the forty-first transistor of the next to last stage GOA unit circuit, and meanwhile, the even stage scan start signal is provided to the gate of the eleventh transistor of the second stage GOA unit circuit; the backward scan of the odd stage GOA unit circuits and the forward scan of the even stage GOA unit circuits are performed at the same time.

10. The gate driving circuit according to claim 2, wherein both the odd stage first scan control signal and the even stage second scan control signal are low voltage level, and both the odd stage second scan control signal and the even stage first scan control signal are high voltage level;

in a scanning period of the frame, the odd stage scan start signal is first provided to the gate of the forty-first transistor of the next to last stage GOA unit circuit, and after scan to all the odd stage GOA unit circuits is accomplished, the even stage scan start signal is provided to the gate of the eleventh transistor of the second stage GOA unit circuit; the backward scan of the odd stage GOA unit circuits and the forward scan of the even stage GOA unit circuits are performed in time division.

11. A gate driving circuit, comprising:
a plurality of GOA unit circuits, wherein respective odd stage GOA unit circuits are cascade connected, and respective even stage GOA unit circuits are cascade connected;
signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;

signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;

a common signal line, employed for providing a first low frequency clock signal and a second low frequency clock signal, located corresponding to all the GOA unit circuits;

the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;

N is set to be a positive integer and except the GOA unit circuits of the first, the second, the next to last and the last stages, in the Nth stage GOA unit circuit:

the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;

the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;

the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;

the pull-down holding module comprises: a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;

the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan;

wherein in the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal;

wherein both the odd stage first scan control signal and the even stage first scan control signal are high voltage level, and both the odd stage second scan control signal and the even stage second scan control signal are low voltage level;

as starting the scan of a frame, the odd stage scan start signal is provided to the gate of the eleventh transistor of the first stage GOA unit circuit, and meanwhile, the even stage scan start signal is provided to the gate of the eleventh transistor of the second stage GOA unit circuit; the forward scan of the odd stage GOA unit circuits and the forward scan of the even stage GOA unit circuits are performed at the same time.

12. A gate driving circuit, comprising:
a plurality of GOA unit circuits, wherein respective odd stage GOA unit circuits are cascade connected, and respective even stage GOA unit circuits are cascade connected;
signal lines respectively employed for providing an odd stage first scan control signal, an odd stage second scan control signal, an odd stage scan start signal, an odd stage first high frequency clock signal, an odd stage second high frequency clock signal, located corresponding to the odd stage GOA unit circuits;

signal lines respectively employed for providing an even stage first scan control signal, an even stage second scan control signal, an even stage scan start signal, an even stage first high frequency clock signal, an even stage second high frequency clock signal, located corresponding to the even stage GOA unit circuits;

a common signal line, employed for providing a first low frequency clock signal and a second low frequency clock signal, located corresponding to all the GOA unit circuits;

the GOA unit circuit of every stage comprises a forward-backward scan control module, a transfer regulation module, an output module, a first pull-down module and a pull-down holding module; the forward-backward scan control module further comprises a first controlling module, and a second controlling module, and the first controlling module functions for pull-up control in forward scan, and functions for pull-down in backward scan; the second controlling module functions for pull-up control in backward scan, and functions for pull-down in forward scan;

N is set to be a positive integer and except the GOA unit circuits of the first, the second, the next to last and the last stages, in the Nth stage GOA unit circuit:

the first controlling module comprises: an eleventh transistor, and a gate of the eleventh transistor is electrically coupled to a stage transfer signal of the N−2th stage GOA unit circuit, and a drain is electrically coupled to a first node, and as N is an odd number, a source is electrically coupled to the odd stage first scan control signal, and as N is an even number, the source is electrically coupled to the even stage first scan control signal;

the second controlling module comprises: a forty-first transistor, and a gate of the forty-first transistor is electrically coupled to a stage transfer signal of the N+2th stage GOA unit circuit, and a drain is electrically coupled to the first node, and as N is an odd number, a source is electrically coupled to the odd stage second scan control signal, and as N is an even number, the source is electrically coupled to the even stage second scan control signal;

the output module comprises: a twenty-first transistor, and a gate of the twenty-first transistor is electrically coupled to the first node, and a drain outputs a scan signal, and as N is an odd number, a source is electrically coupled to the odd stage first high frequency clock signal, and as N is an even number, the source is electrically coupled to the even stage first high frequency clock signal; a twenty-second transistor, and a gate of the twenty-second transistor is electrically coupled to the first node, and a drain outputs a stage transfer signal, and as N is an odd number, a source is electrically coupled to the odd stage first high frequency clock signal, and as N is an even number, the source is electrically coupled to the even stage first high frequency clock signal; a capacitor, and one end of the capacitor is electrically coupled to the first node, and the other end is electrically coupled to the stage transfer signal;

the pull-down holding module comprises: a fifty-fifth transistor, a first pull-down holding module and a second pull-down holding module;

a gate of the fifty-fifth transistor is electrically coupled to the first node, and a source is electrically coupled to a second node, and a drain is electrically coupled to a third node;

the first pull-down holding module comprises: a thirty-third transistor, and a gate of the thirty-third transistor is electrically coupled to the second node, and a source is electrically coupled to the scan signal, and a drain is electrically coupled to a constant low voltage level; a thirty-sixth transistor, and a gate of the thirty-sixth transistor is electrically coupled to the second node, and a source is electrically coupled to the stage transfer signal, and a drain is electrically coupled to the constant low voltage level; a forty-third transistor, and a gate of the forty-third transistor is electrically coupled to the second node, and a source is electrically coupled to the first node, and a drain is electrically coupled to the constant low voltage level; a fifty-first transistor, and both a gate and a source of the fifty-first transistor are electrically coupled to the first low frequency clock signal, and a drain is electrically coupled to a gate of a fifty-third transistor; the fifty-third transistor, and the gate of the fifty-third transistor is electrically coupled to the drain of the fifty-first transistor, and a source is electrically coupled to the first low frequency clock signal, and a drain is electrically coupled to the second node; a fifty-fourth transistor, and a gate of the fifty-fourth transistor is electrically coupled to the second low frequency clock signal, and a source is electrically coupled to the first low frequency clock signal, and a drain is electrically coupled to the second node;

the second pull-down holding module comprises a thirty-second transistor, and a gate of the thirty-second transistor is electrically coupled to the third node, and a source is electrically coupled to the scan signal, and a drain is electrically coupled to the constant low voltage level; a thirty-fifth transistor, and a gate of the thirty-fifth transistor is electrically coupled to the third node, and a source is electrically coupled to the stage transfer signal, and a drain is electrically coupled to the constant low voltage level; a forty-second transistor, and a gate of the forty-second transistor is electrically coupled to the third node, and a source is electrically coupled to the first node, and a drain is electrically coupled to the constant low voltage level; a sixty-first transistor, and both a gate and a source of the sixty-first transistor are electrically coupled to the second low frequency clock signal, and a drain is electrically coupled to a gate of a sixty-third transistor; the sixty-third transistor, and the gate of the sixty-third transistor is electrically coupled to the drain of the sixty-first transistor, and a source is electrically coupled to the second low frequency clock signal, and a drain is electrically coupled to the third node; a sixty-fourth transistor, and a gate of the sixty-fourth transistor is electrically coupled to the first low frequency clock signal, and a source is electrically coupled to the second low frequency clock signal, and a drain is electrically coupled to the third node;

the transfer regulation module comprises a fifty-second transistor, and a gate of the fifty-second transistor is electrically coupled to the first node, and a source is electrically coupled to the second node, and a drain is electrically coupled to the constant low voltage level; a sixty-second transistor, and a gate of the sixty-second transistor is electrically coupled to the first node, and a source is electrically coupled to the third node, and a drain is electrically coupled to the constant low voltage level; a tenth transistor, and a gate of the tenth transistor is electrically coupled to the stage transfer signal of the N+2th stage GOA unit circuit, and a drain is electrically coupled to the second node, and as N is an odd number, a source is electrically coupled to the odd stage first scan control signal, and as N is an even number, the source is electrically coupled to the even stage first scan control signal; a twelfth transistor, and a gate of the twelfth transistor is electrically coupled to the stage transfer signal of the N+2th stage GOA unit circuit, and a drain is electrically coupled to the third node, and as N is an odd number, a source is electrically coupled to the odd stage first scan control signal, and as N is an even number, the source is electrically coupled to the even stage first scan control signal; a fifty-sixth transistor, and a gate of the fifty-sixth transistor is electrically coupled to the stage transfer signal of the N−2th stage GOA unit circuit, and a source is electrically coupled to the drain of the fifty-first transistor and the second node, and as N is an odd number, a drain is electrically coupled to the odd stage second scan control signal, and as N is an even number, the drain is electrically coupled to the even stage second scan control signal; a sixty-sixth transistor, and a gate of the sixty-sixth transistor is electrically coupled to the stage transfer signal of the N−2th stage GOA unit circuit, and a source is electrically coupled to the drain of the sixty-first transistor and the third node, and as N is an odd number, a drain is electrically coupled to the odd stage second scan control signal, and as N is an even number, the drain is electrically coupled to the even stage second scan control signal;

the first pull-down module comprises a thirty-first transistor, and a source is electrically coupled to the scan signal, and a drain is electrically coupled to the constant low voltage level, and as N is an odd number, a gate of the thirty-first transistor is electrically coupled to the odd stage second high frequency clock signal, and as N is an even number, the gate of the thirty-first transistor is electrically coupled to the even stage second high frequency clock signal;

the first low frequency clock signal and the second low frequency clock signal are inverse in phase;

as N is an odd number, in the N+2th stage GOA unit circuit, both the source of the twenty-first transistor and the source of the twenty-second transistor are electrically coupled to the odd stage second high frequency clock signal, and the gate of the thirty-first transistor is electrically coupled to the odd stage first high frequency clock signal;

as N is an even number, in the N+2th stage GOA unit circuit, both the source of the twenty-first transistor and the source of the twenty-second transistor are electrically coupled to the even stage second high frequency clock signal, and the gate of the thirty-first transistor is electrically coupled to the even stage first high frequency clock signal;

as the odd stage first scan control signal is high voltage level and the odd stage second scan control signal is low voltage level, the odd stage GOA unit circuits are controlled to perform forward scan; as the odd stage first scan control signal is low voltage level and the odd stage second scan control signal is high voltage level, the odd stage GOA unit circuits are controlled to perform backward scan;

as the even stage first scan control signal is high voltage level and the even stage second scan control signal is low voltage level, the even stage GOA unit circuit is controlled to perform forward scan; as the even stage first scan control signal is low voltage level and the even stage second scan control signal is high voltage level, the even stage GOA unit circuit is controlled to perform backward scan;

wherein in the first stage connection of the gate driving circuit, all the gate of the eleventh transistor, the gate of the fifty-sixth transistor, and the gate of the sixty-sixth transistor are electrically coupled to the odd stage scan start signal; both the source of the twenty-first transistor and the source of the twenty-second transistor are electrically coupled to the odd stage first high frequency clock signal, and the gate of the thirty-first transistor is electrically coupled to the odd stage second high frequency clock signal;

in the second stage connection of the gate driving circuit, all the gate of the eleventh transistor, the gate of the fifty-sixth transistor, and the gate of the sixty-sixth transistor are electrically coupled to the even stage scan start signal; both the source of the twenty-first transistor and the source of the twenty-second transistor are electrically coupled to the even stage first high frequency clock signal, and the gate of the thirty-first transistor is electrically coupled to the even stage second high frequency clock signal;

in the next to last stage connection of the gate driving circuit, all the gate of the forty-first transistor, the gate of the tenth transistor, and the gate of the twelfth transistor are electrically coupled to the odd stage scan start signal; both the source of the twenty-first transistor and the source of the twenty-second transistor are electrically coupled to the odd stage second high frequency clock signal, and the gate of the thirty-first transistor is electrically coupled to the odd stage first high frequency clock signal;

in the last stage connection of the gate driving circuit, all the gate of the forty-first transistor, the gate of the tenth transistor, and the gate of the twelfth transistor are electrically coupled to the even stage scan start signal; both the source of the twenty-first transistor and the source of the twenty-second transistor are electrically coupled to the even stage second high frequency clock signal, and the gate of the thirty-first transistor is electrically coupled to the even stage first high frequency clock signal;

wherein both the odd stage first scan control signal and the even stage first scan control signal are high voltage level, and both the odd stage second scan control signal and the even stage second scan control signal are low voltage level;

in a scanning period of the frame, the odd stage scan start signal is first provided to the gate of the eleventh transistor of the first stage GOA unit circuit, and after scan to all the odd stage GOA unit circuits is accomplished, the even stage scan start signal is provided to the gate of the eleventh transistor of the second stage GOA unit circuit; the forward scan of the odd stage GOA unit circuits and the forward scan of the even stage GOA unit circuits are performed in time division.

* * * * *